(12) United States Patent
Kim

(10) Patent No.: US 12,176,502 B2
(45) Date of Patent: Dec. 24, 2024

(54) BATTERY APPARATUS AND DIAGNOSING METHOD OF HEATER

(71) Applicant: LG Energy Solution, Ltd., Seoul (KR)

(72) Inventor: Dong Hyeon Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 499 days.

(21) Appl. No.: 17/633,752

(22) PCT Filed: Jul. 2, 2021

(86) PCT No.: PCT/KR2021/008398
§ 371 (c)(1),
(2) Date: Feb. 8, 2022

(87) PCT Pub. No.: WO2022/039382
PCT Pub. Date: Feb. 24, 2022

(65) Prior Publication Data
US 2022/0271362 A1    Aug. 25, 2022

(30) Foreign Application Priority Data
Aug. 21, 2020    (KR) .......................... 10-2020-0105145

(51) Int. Cl.
*H01M 10/63* (2014.01)
*H01M 10/48* (2006.01)
*H01M 10/615* (2014.01)

(52) U.S. Cl.
CPC .......... *H01M 10/63* (2015.04); *H01M 10/48* (2013.01); *H01M 10/615* (2015.04)

(58) Field of Classification Search
CPC .... H01M 10/63; H01M 10/48; H01M 10/615; H01M 10/625; H01M 10/6571; B60L 3/0023; B60L 58/27; B60L 3/0046; B60L 50/51; H05B 1/0236; H05B 1/02; Y02E 60/10; G01R 31/36; G01R 31/007; G01R 19/2503; G01R 19/0053; G01R 19/165;
(Continued)

(56) References Cited

U.S. PATENT DOCUMENTS
7,327,122 B2    2/2008    Kamenoff
2007/0139007 A1    6/2007    Im et al.
(Continued)

FOREIGN PATENT DOCUMENTS
CN    107825968 A    3/2018
CN    108099685 A    6/2018
(Continued)

OTHER PUBLICATIONS

Extended European Search Report for Application No. 21852025.2 dated Sep. 14, 2022, pp. 1-4.
(Continued)

*Primary Examiner* — Abdullah A Riyami
*Assistant Examiner* — Nader J Alhawamdeh
(74) *Attorney, Agent, or Firm* — Lerner David LLP

(57) ABSTRACT

A processor of a battery apparatus detects voltages of a first terminal and a second terminal of a relay coil included in a relay before closing the relay to operate the heater, and diagnoses the heater based on a voltage which the voltage of the first terminal and the voltage of the second terminal correspond to among a high voltage and a low voltage for driving the relay, and a voltage for diagnosis.

20 Claims, 4 Drawing Sheets

(58) Field of Classification Search
CPC .. B60Y 2200/91; B60Y 2200/92; Y02T 10/70
See application file for complete search history.

(56) References Cited

U.S. PATENT DOCUMENTS

| | | | |
|---|---|---|---|
| 2015/0323603 A1 | 11/2015 | Kim et al. | |
| 2019/0016232 A1* | 1/2019 | Kim | H01M 10/44 |
| 2019/0067761 A1* | 2/2019 | Catolico | H01M 10/63 |
| 2019/0348724 A1* | 11/2019 | Satoh | H02J 7/04 |
| 2020/0203957 A1 | 6/2020 | Jin | |
| 2020/0295586 A1* | 9/2020 | Jeong | H02J 7/0014 |
| 2022/0271362 A1* | 8/2022 | Kim | B60L 58/27 |

FOREIGN PATENT DOCUMENTS

| | | |
|---|---|---|
| CN | 105226757 B | 7/2018 |
| EP | 3296142 A1 | 3/2018 |
| JP | H06072068 A | 3/1994 |
| JP | 2004178967 A | 6/2004 |
| JP | 2016152067 A | 8/2016 |
| JP | 2017143691 A | 8/2017 |
| JP | 2017210936 A | 11/2017 |
| JP | 2019021446 A | 2/2019 |
| JP | 2020061882 A | 4/2020 |
| KR | 100649570 B1 | 11/2006 |
| KR | 200442744 Y1 | 12/2008 |
| KR | 101416126 B1 | 7/2014 |
| KR | 101551088 B1 | 9/2015 |
| KR | 20170104942 A | 9/2017 |
| KR | 20180017265 A | 2/2018 |
| KR | 20200058997 A | 5/2020 |
| KR | 20200079012 A | 7/2020 |

OTHER PUBLICATIONS

International Search Report for PCT/KR2021/008398 dated Oct. 12, 2021. 4 pgs.

* cited by examiner

BATTERY APPARATUS AND DIAGNOSING METHOD OF HEATER

CROSS-REFERENCE TO RELATED APPLICATION

The present application is a national phase entry under 35 U.S.C. § 371 of International Application No. PCT/KR2021/008398 filed Jul. 2, 2021, which claims priority from Korean Patent Application No. 10-2020-0105145 filed in the Korean Intellectual Property Office on Aug. 21, 2020, all of which are incorporated herein by reference.

TECHNICAL FIELD

The described technology relates to a battery apparatus and a diagnosing method of a heater.

BACKGROUND ART

An electric vehicle or a hybrid vehicle is a vehicle that obtains power by driving a motor mainly using a battery as a power supply. The electric vehicles are being actively researched because they are alternatives that can solve pollution and energy problems of internal combustion vehicles. Rechargeable batteries are used in various external apparatuses other than the electric vehicles.

An inverter is used to drive a motor in the vehicle such as the electric vehicle. The inverter converts DC power of a battery into AC power (e.g., three-phase power) to drive the motor. The inverter converts the DC power to the AC power by repeatedly turning on/off several switches. In this case, if the frequency of turning on/off the switches increase and current consumption increases in order to quickly drive the motor, an electromagnetic interference (EMI) signal may be generated. Such an EMI signal is induced through a contactor of a heater relay for driving a heater mounted on a battery to apply AC noise to a coil of the heater relay. The AC noise may affect the coil and cause misdiagnosis of the heater.

SUMMARY

Technical Problem

Some embodiments provide a battery apparatus and a diagnosing method of a heater for preventing erroneous diagnosis of the heater

Technical Solution

According to an embodiment, a battery apparatus including a battery pack, a heater connected between a positive terminal and a negative terminal of the battery pack, and a processor configured to control the heater may be provided. The heater may include a relay, a heating resistor, a first driver, and a second driver. The relay may include a relay switch and a relay coil configured to drive the relay switch, and the relay switch and the heating resistor may be connected in series between the positive terminal and the negative terminal. The first driver may be connected between a power supply and a first terminal of the relay coil, and configured to control transfer of a first voltage. The second driver may be connected between a second terminal of the relay coil and a terminal having a second voltage lower than the first voltage, and may control transfer of the second voltage. The processor may control the first driver and the second driver, and diagnose the heater based on a first measured voltage of the first terminal of the relay coil and a second measured voltage of the second terminal of the relay coil while a third voltage is applied to the second terminal of the relay coil.

In some embodiments, the battery apparatus may further include a diode connected between a diagnostic power supply configured to supply the third voltage and the second terminal of the relay coil. In this case, the third voltage may be lower than the first voltage and higher than the second voltage.

In some embodiments, the processor may detect the first measured voltage of the first terminal and the second measured voltage of the second terminal before operating the heater by enabling the first driver and the second driver.

In some embodiments, in response to the first measured voltage of the first terminal and the second measured voltage of the second terminal corresponding to the third voltage, respectively, the processor may enable the first driver and the second driver to operate the heater.

In some embodiments, in response to the first measured voltage of the first terminal and the second measured voltage of the second terminal corresponding to the first voltage, respectively, the processor may enable the second driver. Further, the processor may detect a third measured voltage of the first terminal while the second driver is enabled, and diagnose the heater based on the third measured voltage of the first terminal . . . .

In some embodiments, in response to the third measured voltage of the first terminal corresponding to the second voltage, the processor may enable the first driver and the second driver to operate the heater.

In some embodiments, in response to the third measured voltage of the first terminal corresponding to the first voltage, the processor may diagnose a failure in the first driver.

In some embodiments, in response to the first measured voltage of the first terminal and the second measured voltage of the second terminal corresponding to the second voltage, respectively, the processor may enable the first driver. Further, the processor may detect a third measured voltage of the second terminal while the first driver is enabled, and diagnose the heater based on the third measured voltage of the second terminal.

In some embodiments, in response to the third measured voltage of the second terminal corresponding to the first voltage, the processor may enable the first driver and the second driver to operate the heater.

In some embodiments, in response to the third measured voltage of the second terminal corresponding to the second voltage, the processor may diagnose a failure in the second driver.

According to another embodiment, a diagnosing method of a battery apparatus including a battery pack and a heater configured to heat the battery pack may be provided. The diagnosing method may include, before closing a relay configured to control a current flowing to a heating resistor of the heater, detecting a first measured voltage of a first terminal and a second measured voltage of a first terminal and a second terminal of a relay coil included in the relay, and diagnosing the heater based on a first measured voltage at the first terminal and a second measured voltage at the second terminal corresponding to at least one of a first voltage, a second voltage, or a third voltage. In this case, the first voltage and the second voltage may be adapted to drive the relay, the first voltage may be higher than the second voltage, and the third voltage may be between the first voltage and the second voltage.

According to yet another embodiment, a battery apparatus including a battery pack, a heater, and a processor may be provided. The heater may include a heating resistor and a relay configured to control a current flowing to the heating resistor. The processor may detect first and second measured voltages of a first terminal and a second terminal, respectively, of a relay coil included in the relay while the relay is open, and diagnose the heater based on which of a first voltage, a second voltage, or a third voltage the first measured voltage of the first terminal and the second measured voltage of the second terminal correspond to. In this case, the first voltage and the second voltage may be adapted to drive the relay, the first voltage may be higher than the second voltage, and the third voltage may be between the first voltage and the second voltage.

Advantageous Effects

According to some embodiments, the heater can be diagnosed based on a voltage of a relay coil. According to other some embodiments, it is possible to diagnose whether the voltage of the relay coil is not detected as the normal value due to a failure in the driver or the EMI signal.

DETAILED DESCRIPTION

Figure 1:
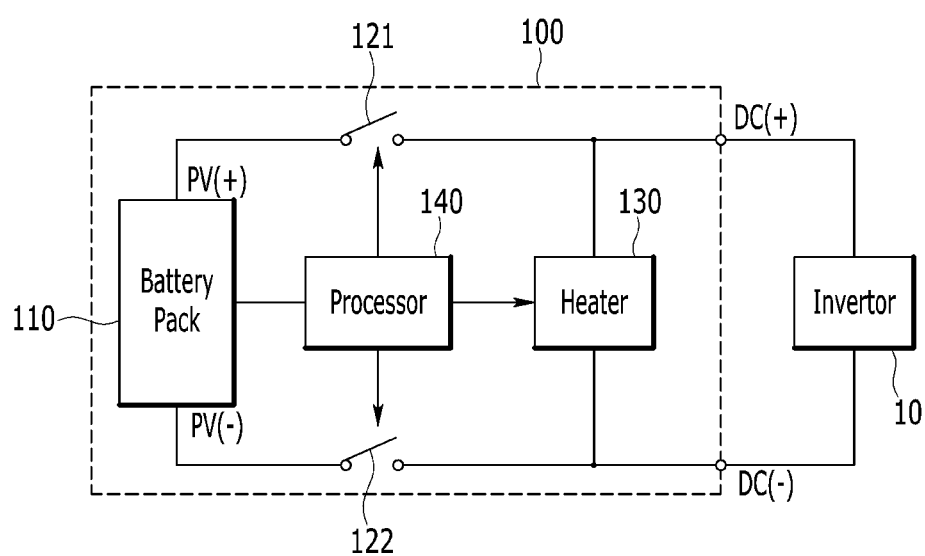
FIG. 1 is a diagram showing a battery apparatus according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

FIG. 1 is a diagram showing a battery apparatus according to an embodiment.

Referring to FIG. 1, a battery apparatus 100 has a structure that can be electrically connected to an external apparatus through a positive link terminal DC (+) and a negative link terminal DC (−). In some embodiments, the battery apparatus 100 may be connected to an inverter 10 of the external apparatus through the positive link terminal DC (+) and the negative link terminal DC (−). When the external apparatus is a load, the battery apparatus 100 is discharged by operating as a power supply that supplies power to the load. The external apparatus operating as the load may be, for example, an electronic device, a mobility apparatus, or an energy storage system (ESS). The mobility apparatus may be, for example, a vehicle such as an electric vehicle, a hybrid vehicle, or a smart mobility.

The battery apparatus 100 includes a battery pack 110, a main positive switch 121, a main negative switch 122, a heater 130, and a processor 140.

The battery pack 110 includes a plurality of battery cells (not shown), and has a positive terminal PV (+) and a negative terminal PV (−). In some embodiments, the battery cell may be a rechargeable cell. In one embodiment, in the battery pack 110, a predetermined number of battery cells are connected in series to configure a battery module to supply desired power. In another embodiment, in the battery pack 110, a predetermined number of battery modules may be connected in series or in parallel to supply desired power.

The main positive switch 121 is connected between the positive terminal PV (+) of the battery pack 110 and the positive link terminal DC (+) of the battery apparatus 100. The main negative switch 122 is connected between the negative terminal PV (−) of the battery pack 110 and the negative link terminal DC (−) of the battery apparatus 100. The switches 121 and 122 may be controlled by the processor 140 to control an electrical connection between the battery pack 110 and the external apparatus. In one embodiment, each of the switches 121 and 122 may be a contactor implemented in a relay. In another embodiment, each of the switches 121 and 122 may be an electrical switch such as a transistor. In some embodiments, the battery apparatus 100 may further include driving circuits (not shown) for controlling the switches 121 and 122, respectively.

The heater 130 controls a temperature by heating the battery pack 110.

The processor 140 controls the switches 121 and 122 and the heater 130, and may be, for example, a micro controller unit (MCU).

In some embodiments, the battery apparatus 100 may further include various monitoring circuits (not shown). Various monitoring circuits may monitor a voltage, a temperature, a current, and the like of the battery pack 110. The processor 140 may determine a state of the battery pack 110 based on information monitored by various monitoring circuits. In some embodiments, the processor 140 may control an operation of the heater 130 based on the temperature of the battery pack 110.

Figure 2:
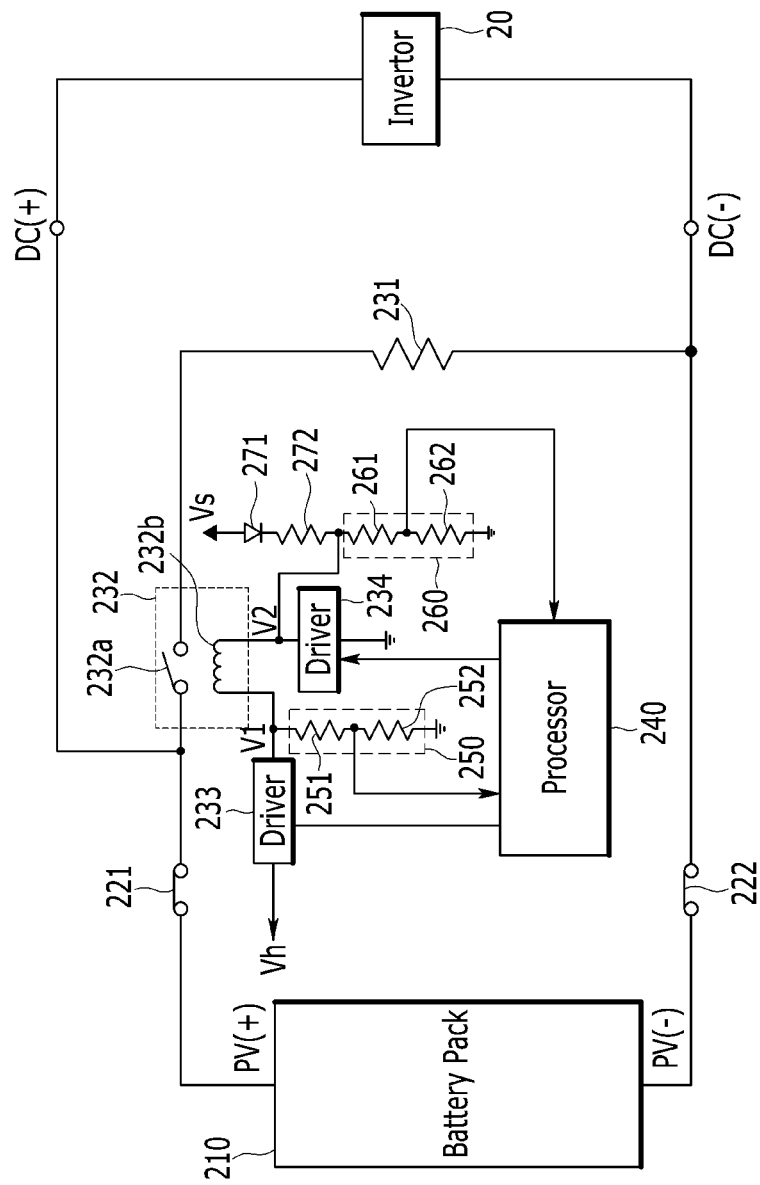
FIG. 2 is a diagram showing a battery apparatus for a heater diagnosis according to an embodiment.

FIG. 2 is a diagram showing a battery apparatus for a heater diagnosis according to an embodiment.

Referring to FIG. 2, a battery apparatus includes a battery pack 210, a main positive switch 221, a main negative switch 222, a heater, and a processor 240. The heater includes a heating resistor 231, a relay 232, and drivers 233 and 234.

The heating resistor 231 may generate heat when a current flows, and then heat the battery pack 210 to raise a temperature. The relay 232 includes a relay switch 232a and a relay coil 232b for driving the relay switch 232a. The relay switch 232a and the heating resistor 231 are connected in series between a positive terminal PV (+) of the battery pack 210 and a negative terminal PV (−) of the battery pack 210. When the relay switch 232a is turned on, a current may flow from the battery pack 210 to the heating resistor 231 to heat the battery pack 210.

In some embodiments, a first terminal of the main positive switch 221 may be connected to the positive terminal PV (+) of the battery pack 210, and a first terminal of the main negative switch 222 may be connected to the negative terminal PV (−)) of the battery pack 210. In this case, the relay switch 232a and the heating resistor 231 may be connected in series between a second terminal of the main positive switch 221 and a second terminal of the main negative switch 222. In one embodiment, as shown in FIG. 2, a first terminal of the relay switch 232a may be connected to the second terminal of the main positive switch 221, a second terminal of the relay switch 232a may be connected to a first terminal of the heating resistor 231, and a second terminal of the heating resistor 231 may be connected to the second terminal of the main negative switch 222. In another embodiment, the first terminal of the heating resistor 231 may be connected to the second terminal of the main positive switch 221, the second terminal of the heating resistor 231 may be connected to the first terminal of the relay switch 232a and the second terminal of the relay switch 232a may be connected to the second terminal of the main negative switch 222.

The driver 233 transfers a supply voltage Vh from a predetermined power supply to a first terminal of the relay coil 232b in response to an enable signal from the processor 240. The driver 234 connects a second terminal of the relay coil 232b to a terminal having a potential lower than the supply voltage Vh in response to an enable signal from the processor 240. Accordingly, a current may flow through the relay coil 232b. In this case, the first terminal of the relay coil 232b may be referred to as a high side terminal, and the second terminal of the relay coil 232b may be referred to as a low side terminal. In addition, the driver 233 may be referred to as a high side driver (HSD) and the driver 234 may be referred to as a low side driver (LSD).

In some embodiments, the terminal having the potential lower than the supply voltage Vh may be a ground terminal. Hereinafter, the terminal having the potential lower than the supply voltage Vh is described as the ground terminal. In some embodiments, the enable signal may be a control signal having an enable level from the processor 240. When the drivers 233 and 234 are disabled, the control signals may have a disable level.

In some embodiments, a first terminal of the driver 233 may be connected to the predetermined power supply supplying the supply voltage Vh, and a second terminal of the driver 233 may be connected to the first terminal of the relay coil 232b. A first terminal of the driver 234 may be connected to the second terminal of the relay coil 232b, and a second terminal of the driver 234 may be connected to the ground terminal. In some embodiments, the power supply Vh for supplying the predetermined voltage may be a battery different from the battery pack 210. In some embodiments, the driver 233 may include a switch that is turned on in response to the enable signal from processor 240, and the driver 234 may include a switch that is turned on in response to the enable signal from processor 240.

In some embodiments, the processor 240 may transfer the enable signal for closing the relay 232 to the drivers 233 and 234 of the heater when the temperature of the battery pack 210 is lower than a reference temperature. When the temperature of the battery pack 210 is high and heating of the battery pack 210 is not required, the processor 240 may transfer the disable signal for opening the relay 232 to the drivers 233 and 234 of the heater. Closing of the relay 232 may be referred to as an on of the relay, and opening of the relay 232 may be referred to as an off of the relay.

In some embodiments, the battery apparatus may further include voltage sensing circuits 250 and 260 for voltage sensing of the processor 240.

The voltage sensing circuit 250 measures a voltage V1 of a contact point between the relay coil 232b and the driver 233, i.e., the voltage V1 of the first terminal of the relay coil 232b (or the second terminal of the driver 233). The voltage sensing circuit 260 measures a voltage V2 of a contact point between the relay coil 232b and the driver 234, i.e., the voltage V2 of the second terminal of the relay coil 232b (or the first terminal of the driver 234).

In some embodiments, as shown in FIG. 2, the voltage sensing circuit 250 may include a plurality of resistors 251 and 252 connected in series between the first terminal of the relay coil 232b and the ground terminal. In this case, the processor 240 may detect the voltage of the first terminal of the relay coil 232b based on a voltage of a contact point between the resistors 251 and 252. In one embodiment, an analog-to-digital converter for converting the voltage of the contact point between the resistors 251 and 252 into a digital signal and transferring the digital signal to the processor 240 may be further provided.

In some embodiments, as shown in FIG. 2, the voltage sensing circuit 260 may include a plurality of resistors 261 and 262 connected in series between the second terminal of the relay coil 232b and the ground terminal. In this case, the processor 240 may detect the voltage of the second terminal of the relay coil 232b based on a voltage of a contact point between the resistors 261 and 262. In one embodiment, an analog-to-digital converter for converting the voltage of the contact point between the resistors 261 and 262 into a digital signal and transferring the digital signal to the processor 240 may be further provided.

In some embodiments, the battery apparatus may further include a diode 271 connected between a power supply for supplying a diagnostic voltage Vs for diagnosis of the heater and a contact point between the second terminal of the relay coil 232b and the resistor 261. In some embodiments, the diagnostic voltage Vs may be a voltage lower than the supply voltage Vh. Since the supply voltage Vh is higher than the diagnostic voltage Vs, the diode 271 may block a current path to be formed from the relay coil 232b to the power supply supplying the diagnostic voltage Vs. In some embodiments, the voltage sensing circuit 260 may further include a resistor 272 connected between the diode 271 and the contact point. In this case, an anode of the diode 271 may be connected to the power supply Vs, and the resistor 272 may be connected between a cathode of the diode 271 and the contact point. For example, the supply voltage Vh may be 12 V and the diagnostic voltage Vs may be 5 V.

An EMI signal generated from the inverter 20 connected to the battery apparatus may flow into the relay coil 232b so that the voltages V1 and V2 of the two terminals of the relay coil 232b of the heater may be detected as values different from normal voltages. Alternatively, the Vh voltage or 0 V may be transferred to the relay coil 232b due to a failure in the drivers 233 and 234, so that the voltages V1 and V2 of the two terminals of the relay coil 232b of the heater may detected as values different from the normal voltages.

Next, a diagnosing method of the heater is described with reference to FIG. 3 to FIG. 5.

Figure 3:
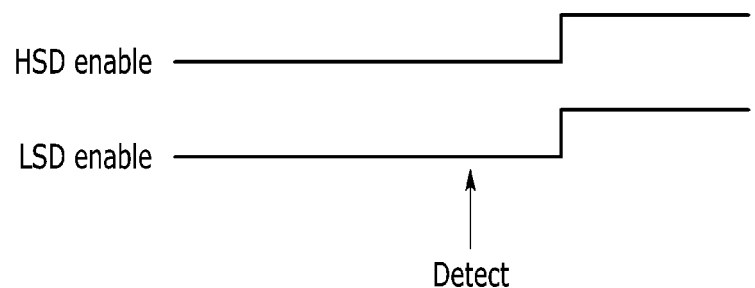
FIG. 3 is a diagram showing control signals in a case where a voltage of a relay coil is normally detected in a battery apparatus according to an embodiment.
Figure 4:
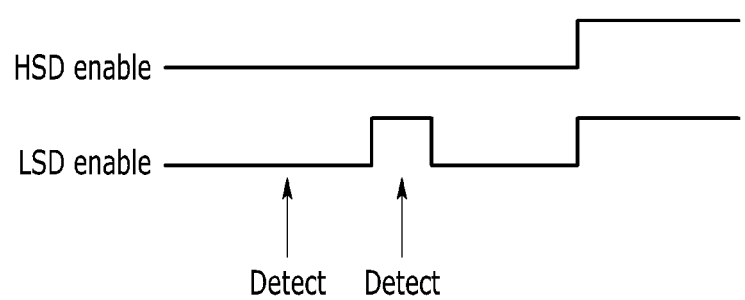
FIG. 4 and FIG. 5 are diagrams showing control signals in a case where a voltage of a relay coil is not normally detected in a battery apparatus according to various embodiments.
Figure 5:
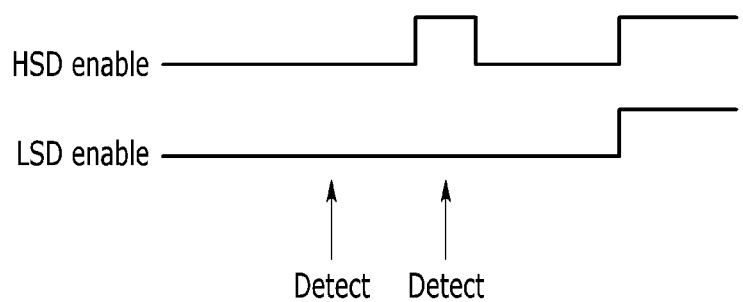

FIG. 3 is a diagram showing control signals in a case where a voltage of a relay coil is normally detected in a battery apparatus according to an embodiment, and FIG. 4 and FIG. 5 are diagrams showing control signals in a case where a voltage of a relay coil is not normally detected in a battery apparatus according to various embodiments. While it has been shown in FIG. 3, FIG. 4, and FIG. 5 that a driver is enabled when a control signal has a high level, and the driver is disabled when the control signal has a low level, the driver may be disabled when the control signal has the high level, and may be enabled when the control signal has the low level. It is shown in FIG. 3, FIG. 4, and FIG. 5 that a driver connected to a high side terminal of a relay coil is shown as an HSD, and a driver connected to a low side terminal of the relay coil is shown as an LSD.

Referring to FIG. 2 and FIG. 3, a processor 240 detects voltages of both terminals of a relay coil 232b before closing a heater relay 232. That is, the processor 240 detects the voltages of both terminals of the relay coil 232b before applying an enable signal to two drivers 233 and 234. In this case, a disable signal may be applied to the two drivers 233 and 234.

Since the enable signal has not been applied to the two drivers 233 and 234 yet, the two drivers 233 and 234 are in disabled states if there is no failure. When the two drivers 233 and 234 are in the disabled states, a diagnostic voltage Vs is applied to the relay coil 232b, so that the voltage V1 of the first terminal and the voltage V2 of the second terminal in the relay coil 232b become approximately the voltage Vs due to the diagnosis voltage Vs. In some embodiments, the processor 240 may detect that the voltage V1 of the first terminal of the relay coil 232b is the voltage Vs by sensing a voltage at which the voltage Vs is divided by resistors 251 and 252. Further, the processor 240 may detect that the voltage V2 of the second terminal of the relay coil 232b is the Vs voltage by sensing a voltage at which the Vs voltage is divided by resistors 272, 261, and 262.

As such, when the voltages V1 and V2 of the both terminals of the relay coil 232b are the Vs voltages, the drivers 233 and 234 operate normally and the EMI signal also does not affect the relay coil 232b, so that the heater operates normally. Accordingly, the processor 240 drives the heater by applying the enable signal to each of the two drivers 233 and 234. That is, the drivers 233 and 234 are enabled so that a current flows through the relay coil 232b by a supply voltage Vh, and accordingly, the relay switch 232a can be turned on.

On the contrary, before the enable signal is applied to each of the two drivers 233 and 234, the processor 240 may detect that the voltage V1 of the first terminal of the relay coil 232b and the voltage V2 of the second terminal of the relay coil 232b are voltages other than the Vs voltage. In this case, the processor 240 may detect the voltage V1 of the first terminal of the relay coil 232b or the voltage V2 of the second terminal of the relay coil 232b by applying the enable signal to the driver 233 or the driver 234, thereby diagnosing a status of the heater.

In some embodiments, the processor 240 may apply the enable signal to the driver 233 to detect the voltage V1 of the first terminal of the relay coil 232b or the voltage V2 of the second terminal of the relay coil 232b, thereby diagnosing the status of the heater. Hereinafter, such an embodiment is described with reference to FIG. 2 and FIG. 4.

Before applying an enable signal to each of two drivers 233 and 234, a processor 240 may detect a voltage V1 of a first terminal of a relay coil 232b and a voltage V2 of a second terminal of the relay coil 232b as an approximately Vh voltage. In some embodiments, the processor 240 may detect that the voltage V1 of the first terminal of the relay coil 232b is the voltage Vh by sensing a voltage at which the voltage Vh is divided by resistors 251 and 252. Further, the processor 240 may detect that the voltage V2 of the second terminal of the relay coil 232b is the voltage Vh by sensing a voltage at which the voltage Vh is divided by resistors 261 and 262.

In this case, a short failure may occur in the driver 233 so that the supply voltage Vh may be transferred to the relay coil 232b. As a result, the voltages V1 and V2 of the both terminals of the relay coil 232b may become the approximately Vh voltage. Alternatively, although the driver 233 operates normally, an EMI signal may be applied to the relay coil 232b so that the voltages V1 and V2 of the both terminals of the relay coil 232b may become the approximately Vh voltage.

Referring to FIG. 4, the processor 240 may apply the enable signal to the driver 234 while continuously applying a disable signal to the driver 233, in order to determine whether the short failure occurs in the driver 233 or the EMI signal is applied. While applying the control signals as described above, the processor 240 may detect the voltages V1 and V2 of the both terminals of the relay coil 232b.

The driver 234 is enabled to apply 0 V to the second terminal of the relay coil 232b. Further, the voltage Vh is applied to the first terminal of the relay coil 232b in case of the short failure of the driver 233. The processor 240 may detect the voltage V1 of the first terminal of the relay coil 232b as the approximately Vh voltage and the voltage V2 of the second terminal of the relay coil 232b as approximately 0 V. Accordingly, when the processor 240 detects the voltage V1 of the first terminal of the relay coil 232b as the approximately Vh voltage, the processor 240 diagnoses the driver 233 as the short failure and sends a warning that notifies the short failure of the driver 233 to an external apparatus, e.g., a vehicle.

On the other hand, when the driver 233 is not in a state of the short failure but operates normally, the driver 233 is disabled and the driver 234 is enabled to apply 0 V to the both terminals of the relay coil 232b. In this case, the processor 240 may detect the voltages V1 and V2 of the both terminals of the relay coil 232b as approximately 0 V. Therefore, when the processor 240 detects the voltage V1 of the first terminal of the relay coil 232b as approximately 0 V, the processor 240 determines that the voltage of the relay coil 232b is incorrectly sensed due to the EMI signal, and then operates the heater normally. Accordingly, the processor 240 may apply the enable signal to each of the two drivers 233 and 234.

In some embodiments, the processor 240 may apply the enable signal to the driver 234 to detect the voltage V1 of the first terminal of the relay coil 232b or the voltage V2 of the second terminal of the relay coil 232b, thereby diagnosing the status of the heater. Hereinafter, such an embodiment is described with reference to FIG. 2 and FIG. 5.

Before applying an enable signal to each of the two drivers 233 and 234, a processor 240 may detect a voltage V1 of a first terminal of a relay coil 232b and a voltage V2 of a second terminal of the relay coil 232b as approximately 0 V. In some embodiments, the processor 240 may detect that the voltage V1 of the first terminal of the relay coil 232b is 0 V by sensing a voltage at which 0 V is divided by resistors 251 and 252. Further, the processor 240 may detect that the voltage V2 of the second terminal of the relay coil 232b is 0 V by sensing a voltage at which 0 V is divided by resistors 261 and 262.

In this case, a short failure may occur in the driver 234 so that 0 V may be transferred to the relay coil 232b. As a result, the voltages V1 and V2 of the both terminals of the relay coil 232b may become approximately 0 V. Alternatively, although the driver 234 operates normally, an EMI signal may be applied to the relay coil 232b so that the voltages V1 and V2 of the both terminals of the relay coil 232b may become approximately 0 V.

Referring to FIG. 5, the processor 240 may apply the enable signal to the driver 233 while continuously applying a disable signal to the driver 234, in order to determine whether the short failure occurs in the driver 234 or the EMI signal is applied. While applying the control signals as described above, the processor 240 may detect the voltages V1 and V2 of the both terminals of the relay coil 232b.

The driver 233 is enabled to apply the Vh voltage to the first terminal of the relay coil 232b. At this time, 0 V is applied to the second terminal of the relay coil 232b in case of the short failure of the driver 234. The processor 240 may detect the voltage V1 of the first terminal of the relay coil 232b as the approximately Vh voltage and the voltage V2 of the second terminal of the relay coil 232b as approximately 0 V. Accordingly, when the processor 240 detects the voltage V2 of the second terminal of the relay coil 232b as approximately 0 V, the processor 240 diagnoses the driver 234 as the short failure and sends a warning that notifies the short failure of the driver 234 to an external apparatus, e.g., a vehicle.

On the other hand, when the driver 234 is not in a state of the short failure but operates normally, the driver 233 is enabled and the driver 234 is disabled to apply the Vh voltage to the both terminals of the relay coil 232b. In this case, the processor 240 may detect the voltages V1 and V2 of the both terminals of the relay coil 232b as the approximately Vh voltage. Therefore, when the processor 240 detects the voltage V2 of the second terminal of the relay coil 232b as the approximately Vh voltage, the processor 240 determines that the voltage of the relay coil 232b is incorrectly sensed due to the EMI signal, and then operates the heater normally. Accordingly, the processor 240 may apply the enable signal to each of the two drivers 233 and 234.

According to the above-described embodiments, it can be diagnosed whether the voltage of the relay coil is sensed as a normal value. Further, it is possible to diagnose whether the voltage of the relay coil is not detected as the normal value due to the driver failure or the EMI signal. Accordingly, in case of the driver failure, a warning may be issued to request repair or replacement of the driver. If the voltage is incorrectly sensed by the EMI signal, the heater can be operated normally because there is no failure in the driver.

Figure 6:
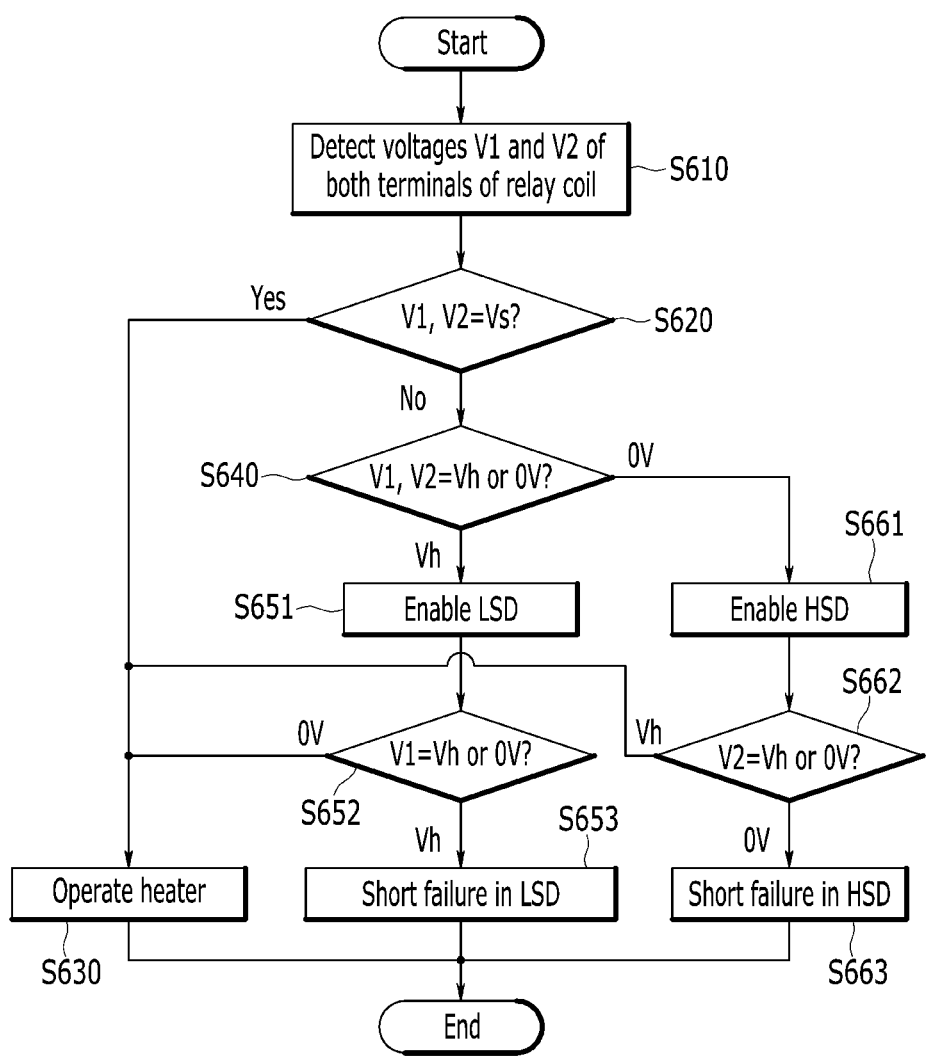
FIG. 6 is a flowchart showing a method for diagnosing a heater of a battery apparatus according to an embodiment.

FIG. 6 is a flowchart showing a method for diagnosing a heater of a battery apparatus according to an embodiment.

Referring to FIG. 6, before transferring voltages for driving a relay to both terminals of a relay coil (e.g., 232b in FIG. 2) of a heater, a processor of a battery apparatus detects voltages V1 and V2 of the both terminals of the relay coil 232b at step S610. In some embodiments, the processor may detect the voltages V1 and V2 of the both terminals of the relay coil 232b at step S610 before applying an enable signal to each of two drivers (e.g., 233 and 234 in FIG. 2) connected to the both terminals of the relay coil.

When each of the voltages V1 and V2 of both terminals of the relay coil 232b is detected as a voltage corresponding to a diagnostic voltage (e.g., Vs in FIG. 2) at step S620, the processor operates the heater by diagnosing the heater is in a normal state at step S630. In some embodiments, the processor may apply the enable signal to each of the two drivers 233 and 234 to operate the heater at step S630.

When the voltages V1 and V2 of the both terminals of the relay coil 232b are detected as voltages other than a voltage corresponding to the diagnosis voltage Vs at step S620, the processor may detect the voltages of the relay coil 232b by transferring a supply voltage (e.g., Vh in FIG. 2) of the heater or a voltage (e.g., 0 V in FIG. 2) lower than the supply voltage to one terminal of the relay coil.

In some embodiments, when the voltages V1 and V2 of the both terminals of the relay coil 232b are detected as a voltage corresponding to the Vh voltage of the heater at step S640, the processor may transfer 0 V to a low side terminal of the relay coil 232b at step S651. In some embodiments, the processor may apply an enable signal to a driver 234 connected to the low side terminal of the relay coil 232b at step S651. While 0 V is transferred to the low side terminal of the relay coil 232b, the processor detects the voltage V1 of a high side terminal of the relay coil 232b. In some embodiments, the processor may also detect the voltage V2 of the low side terminal of the relay coil 232b. When the voltage V1 of the high side terminal of the relay coil 232b is detected as a voltage corresponding to 0 V at step S652, the processor may operate the heater at step S630 because the heater is in the normal state. In some embodiments, the processor may apply the enable signal to each of the drivers 233 and 234 at step S630 since the drivers 233 and 234 of the heater operate normally. When the voltage V1 of the high side terminal of the relay coil 232b is detected as a voltage corresponding to the Vh voltage at step S652, the processor may diagnose a failure in the heater at step S653. In some embodiments, the processor may diagnose a short failure in the driver 233 at step S653.

In some embodiments, when the voltages V1 and V2 of the both terminals of the relay coil 232b are detected as the voltage corresponding to 0 V at step S640, the processor may transfer the Vh voltage to the high side terminal of the relay coil 232b at step S661. In some embodiments, the process may apply an enable signal to the driver 233 connected to the high side terminal of the relay coil 232b at step S661. While the voltage Vh is transferred to the high side terminal of the relay coil 232b, the processor detects the voltage V2 of the low side terminal of the relay coil 232b. In some embodiments, the processor may also detect the voltage V1 of the high side terminal of the relay coil 232b. When the voltage V2 of the low side terminal of the relay coil 232b is detected as the voltage corresponding to the Vh voltage at step S662, the processor may operate the heater at step S630 because the heater is in the normal state. In some embodiments, the processor may apply the enable signal to each of the drivers 233 and 234 at step S630 since the drivers 233 and 234 of the heater operate normally. When the voltage V2 of the low side terminal of the relay coil 232b is detected as the voltage corresponding to 0 V at step S662, the processor may diagnose the failure in the heater at step S663. In some embodiments, the processor may diagnose the short failure in the driver 234 at step S663.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus comprising:
   a battery pack;
   a heater connected between a positive terminal and a negative terminal of the battery pack; and
   a processor configured to control the heater,
   wherein the heater includes:
      a relay including a relay switch and a relay coil configured to drive the relay switch;
      a heating resistor connected in series with the relay switch between the positive terminal and the negative terminal;
      a first driver connected between a power supply and a first terminal of the relay coil, and configured to control transfer of a first voltage; and
      a second driver connected between a second terminal of the relay coil and a terminal having a second voltage lower than the first voltage, and configured to control transfer of the second voltage,
   wherein the processor is configured to:
      control the first driver and the second driver, and
      diagnose the heater based on a first measured voltage of the first terminal of the relay coil and a second measured voltage of the second terminal of the relay coil while a third voltage is applied to the second terminal of the relay coil.

2. The battery apparatus of claim 1, further comprising a diode connected between a diagnostic power supply configured to supply the third voltage and the second terminal of the relay coil,
   wherein the third voltage is lower than the first voltage and higher than the second voltage.

3. The battery apparatus of claim 1, wherein the processor is configured to:
   detect the first measured voltage of the first terminal and the second measured voltage of the second terminal before operating the heater by enabling the first driver and the second driver.

4. The battery apparatus of claim 3, wherein the processor is configured to enable the first driver and the second driver to operate the heater, in response to the first measured voltage of the first terminal and the second measured voltage of the second terminal corresponding to the third voltage, respectively.

5. The battery apparatus of claim 3, wherein the processor is configured to enable the second driver, in response to the first measured voltage of the first terminal and the second measured voltage of the second terminal corresponding to the first voltage, respectively,
   detect a third measured voltage of the first terminal while the second driver is enabled, and
   diagnose the heater based on the third measured voltage of the first terminal.

6. The battery apparatus of claim 5, wherein the processor is configured to enable the first driver and the second driver to operate the heater, in response to the third measured voltage of the first terminal corresponding to the second voltage.

7. The battery apparatus of claim 5, wherein the processor is configured to diagnose a failure in the first driver, in response to the third measured voltage of the first terminal corresponding to the first voltage.

8. The battery apparatus of claim 3, wherein the processor is configured to enable the first driver, in response to the first measured voltage of the first terminal and the second measured voltage of the second terminal corresponding to the second voltage, respectively,
   detect a third measured voltage of the second terminal while the first driver is enabled, and
   diagnose the heater based on the third measured voltage of the second terminal.

9. The battery apparatus of claim 8, wherein the processor is configured to enable the first driver and the second driver to operate the heater, in response to the third measured voltage of the second terminal corresponding to the first voltage.

10. The battery apparatus of claim 8, wherein the processor is configured to diagnose a failure in the second driver, in response to the second measured voltage of the second terminal corresponding to the second voltage while the control signal to the first driver is at the high level.

11. A diagnosing method of a battery apparatus including a battery pack and a heater configured to heat the battery pack, the diagnosing method comprising:
   before closing a relay configured to control a current flowing to a heating resistor of the heater, detecting a first measured voltage of a first terminal and a second measured voltage of a second terminal of a relay coil included in the relay; and
   diagnosing the heater based on the first measured voltage at the first terminal and the second measured voltage at the second terminal corresponding to at least one of a first voltage, a second voltage, or a third voltage,
   wherein the first voltage and the second voltage are adapted to drive the relay, and
   wherein the first voltage is higher than the second voltage, and
   wherein the third voltage is between the first voltage and the second voltage.

12. The diagnosing method of claim 11, wherein diagnosing the heater includes diagnosing that the heater operates normally in response to detecting the first measured voltage of the first terminal and the second measured voltage of the second terminal to correspond to the third voltage, respectively.

13. The diagnosing method of claim 11, wherein diagnosing the heater includes:
   transferring the second voltage to the second terminal in response to detecting the first measured voltage of the first terminal and the second measured voltage of the second terminal to correspond to the first voltage, respectively;
   detecting a third measured voltage of the first terminal while the second voltage is transferred to the second terminal; and
   diagnosing that the heater operates normally in response to detecting the third measured voltage of the first terminal to correspond to the second voltage.

14. The diagnosing method of claim 11, wherein diagnosing the heater includes:
   transferring the second voltage to the second terminal in response to detecting the first measured voltage of the first terminal and the second measured voltage of the second terminal to correspond to the first voltage, respectively;
   detecting a third measured voltage of the first terminal while the second voltage is transferred to the second terminal; and
   diagnosing a failure in the heater in response to detecting the third measured voltage of the first terminal to correspond to the first voltage.

15. The diagnosing method of claim 11, wherein diagnosing the heater includes:

transferring the first voltage to the first terminal in response to detecting the first measured voltage of the first terminal and the second measured voltage of the second terminal to correspond to the second voltage, respectively;

detecting a third measured voltage of the second terminal while the first voltage is transferred to the first terminal; and diagnosing that the heater operates normally in response to detecting the third measured voltage of the second terminal to correspond to the first voltage.

16. The diagnosing method of claim 11, wherein diagnosing the heater includes:

transferring the first voltage to the first terminal in response to detecting the first measured voltage of the first terminal and the second measured voltage of the second terminal to correspond to the second voltage, respectively;

detecting a third measured voltage of the second terminal while the first voltage is transferred to the first terminal; and diagnosing a failure in the heater in response to detecting the third measured voltage of the second terminal to correspond to the second voltage.

17. A battery apparatus comprising:

a battery pack;

a heater including a heating resistor and a relay configured to control a current flowing to the heating resistor; and a processor configured to:

detect first and second measured voltages of a first terminal and a second terminal, respectively, of a relay coil included in the relay while the relay is open; and diagnose the heater based on which of a first voltage, a second voltage, or a third voltage the first measured voltage of the first terminal and the second measured voltage of the second terminal correspond to, wherein the first voltage and the second voltage are adapted to drive the relay, and wherein the first voltage is higher than the second voltage, and wherein the third voltage is between the first voltage and the second voltage.

18. The battery apparatus of claim 17, wherein the processor is configured to diagnose that the heater operates normally in response to the first measured voltage of the first terminal and the voltage of the second terminal corresponding to the third voltage, respectively.

19. The battery apparatus of claim 17, wherein the processor is configured to:

transfer the second voltage to the second terminal in response to detecting the first measured voltage of the first terminal and the second measured voltage of the second terminal corresponding to the first voltage, respectively;

detect a third measured voltage of the first terminal while the second voltage is transferred to the second terminal; and diagnose the heater based on the third measured voltage of the first terminal.

20. The battery apparatus of claim 17, wherein the processor is configured to:

transfer the first voltage to the first terminal in response to the first measured voltage of the first terminal and the second measured voltage of the second terminal corresponding to the second voltage, respectively;

detect a third measured voltage of the second terminal while the first voltage is transferred to the first terminal; and diagnose the heater based on the third measured voltage of the second terminal.

* * * * *